United States Patent
Subramanian et al.

(10) Patent No.: US 9,660,656 B2
(45) Date of Patent: May 23, 2017

(54) DELAY COMPENSATION

(71) Applicant: SanDisk Technologies Inc., Plano, TX (US)

(72) Inventors: Ramakrishnan Karungulam Subramanian, Bangalore (IN); Anand Venkitachalam, Bangalore (IN); Jayaprakash Naradasi, Bangalore (IN); Prashant Singhal, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 33 days.

(21) Appl. No.: 14/687,586

(22) Filed: Apr. 15, 2015

(65) Prior Publication Data

US 2016/0308540 A1 Oct. 20, 2016

(51) Int. Cl.
| | |
|---|---|
| H03L 7/091 | (2006.01) |
| H03L 7/081 | (2006.01) |
| G06F 1/08 | (2006.01) |
| G06F 1/10 | (2006.01) |
| G06F 13/42 | (2006.01) |
| G06F 13/16 | (2006.01) |

(52) U.S. Cl.
CPC ............... *H03L 7/091* (2013.01); *G06F 1/08* (2013.01); *G06F 1/10* (2013.01); *G06F 13/1689* (2013.01); *G06F 13/4221* (2013.01); *H03L 7/0812* (2013.01)

(58) Field of Classification Search
CPC ... H03L 7/091; H03L 7/0812; G06F 13/4221; G06F 1/10; G06F 1/08
See application file for complete search history.

(56) References Cited

U.S. PATENT DOCUMENTS

| | | | | |
|---|---|---|---|---|
| 5,872,959 | A | * | 2/1999 | Nguyen .............. G06F 13/4217 710/305 |
| 6,720,810 | B1 | | 4/2004 | New |
| 6,995,590 | B1 | | 2/2006 | Pedersen |
| 7,463,075 | B2 | * | 12/2008 | White .................. H03K 5/1565 327/172 |

(Continued)

FOREIGN PATENT DOCUMENTS

| | | |
|---|---|---|
| EP | 2 223 227 A2 | 9/2010 |
| WO | WO 99/17183 A1 | 4/1999 |

OTHER PUBLICATIONS

U.S. Appl. No. 14/133,979, filed Dec. 19, 2013, 121 pages.

(Continued)

*Primary Examiner* — Stefan Stoynov
(74) *Attorney, Agent, or Firm* — Brinks Gilson & Lione

(57) ABSTRACT

Methods and circuits for delay compensation are provided. A data clock may be generated from a peripheral clock. Sample data may be provided in a data signal on a bus in response to an edge of the data clock, where the edge of the data clock is triggered by an initial edge of the peripheral clock. A delay of the data clock relative to the peripheral clock may be selected based on a time difference between the initial edge of the peripheral clock and a time at which the sample data is detected on the bus. A delayed data clock having the selected delay relative to the peripheral clock may be generated. Requested data may be provided on the bus in response to an edge of the delayed data clock.

20 Claims, 7 Drawing Sheets

(56) References Cited

U.S. PATENT DOCUMENTS

| | | | |
|---|---|---|---|
| 7,464,284 B2* | 12/2008 | Arnold | G06F 13/4217 |
| | | | 710/58 |
| 8,106,692 B2 | 1/2012 | Chen | |
| 8,187,936 B2 | 5/2012 | Alsmeier et al. | |
| 8,782,460 B2* | 7/2014 | Gaskins | H03L 7/00 |
| | | | 327/153 |
| 2010/0309744 A1 | 12/2010 | Park | |
| 2014/0266373 A1 | 9/2014 | Goswami et al. | |

OTHER PUBLICATIONS

U.S. Appl. No. 14/136,103, filed Dec. 20, 2013, 56 pages.
Jang et al., "Vertical Cell Array using TCAT(Terabit Cell Array Transistor) Technology for Ultra High Density NAND Flash Memory," *2009 Symposium on VLSI Technology Digest of Technical Papers*, pp. 192-193, 2009.
Arya, P., "A Survey of 3D Nand Flash Memory", *EECS Int'l Graduate Program, National Chiao Tung University*, 2012, pp. 1-11.
Nowak, E. et al., "Intrinsic Fluctuations in Vertical NAND Flash Memories", *2012 Symposium on VLSI Technology Digest of Technical Papers*, 2012, pp. 21-22.
DDRx DLL, dated 2012, pp. 1-4, RTLery, http://rtlery.com/cores/ddrx-dll.
International Search Report, pp. 1-2, dated Jun. 17, 2016, PCT Application No. PCT/US2016/026096, European Patent Office, Rijswijk, The Netherlands.

* cited by examiner

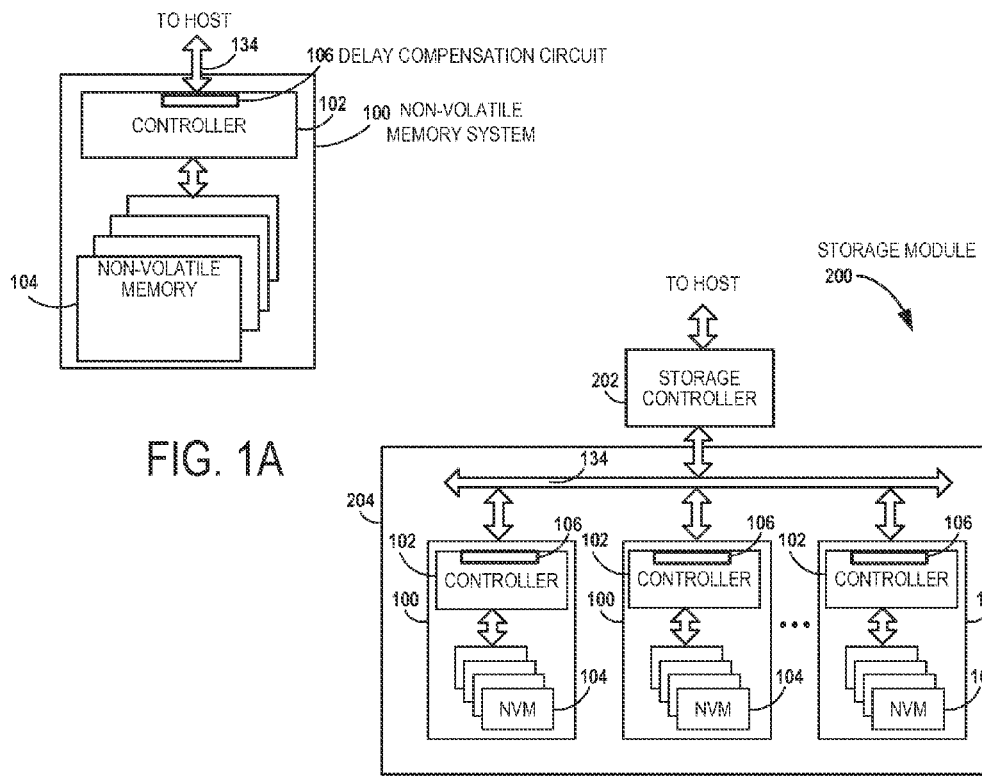
FIG. 1A
FIG. 1B
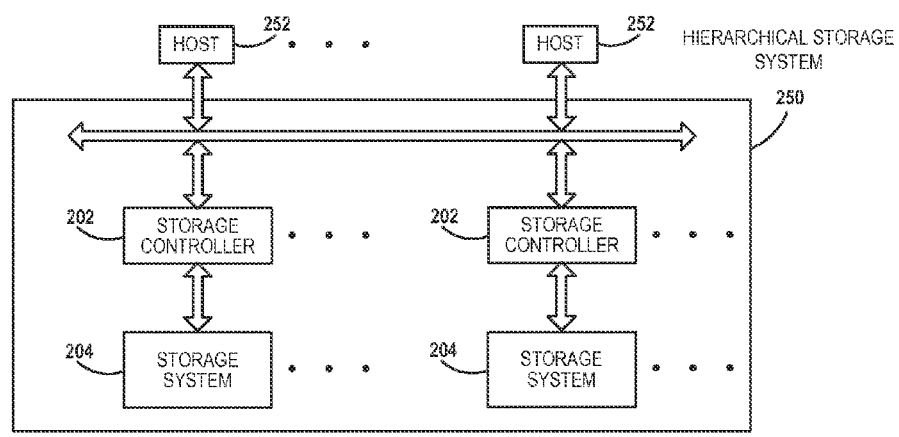
FIG. 1C

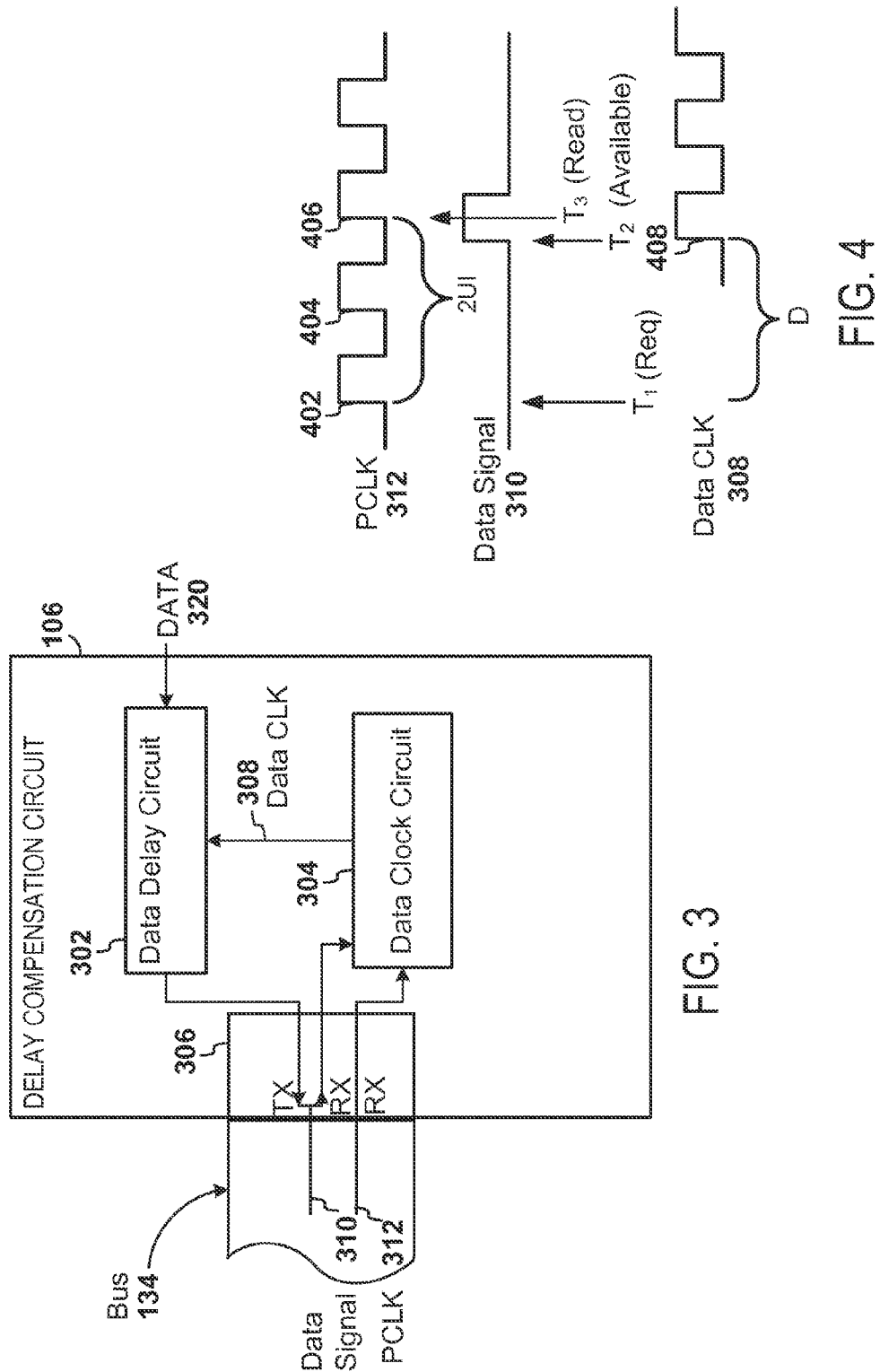

DELAY COMPENSATION

BACKGROUND

Secure Digital (SD) is a standard for nonvolatile memory cards, which may be used in portable devices such as mobile phones and tablet computers. The Secure Digital standard is maintained by the SD Association (SDA).

The SD standard includes an Ultra High Speed, Phase I (UHS-I) bus design for Secure Digital High-Capacity (SDHC) cards and Secure Digital eXtended-Capacity (SDXC) cards. UHS-I is a design enhancement to increase the performance of SDHC and/or SDXC cards.

UHS-I specification defines two bus architecture options supporting up to 50 MB/s (UHS-50) and 104 MB/s (UHS-104) data transfer rates respectively. According to the UHS-I specification, a host provides the memory card with a peripheral clock. UHS-50 supports a peripheral clock frequency of 100 MHz, and UHS 104 supports a peripheral clock frequency of up to 208 MHz. In at least one mode, four bits are transferred over four lines when a data clock signal rises and another four bits on the same four lines when the data clock signals falls, transferring an entire byte on each full clock cycle. UHS-II further raises the data transfer rate to a theoretical maximum of 156 MB/s (full duplex) or 312 MB/s (half duplex) using additional row of pins.

The various supported clock frequencies are theoretic maximums. The actual clock frequencies additionally vary, for example, based on Process, Voltage, and Temperature (PVT).

A controller may handle communication between the host and the nonvolatile memory card. A loop delay in the controller may be the time between when a request for data is received by the controller and when the data is first provided on a bus to the host. The loop delay may include time to retrieve the data from the nonvolatile memory card, delays from logic components of the controller, and even pad delays in an interface with the bus.

The loop delay may vary significantly. For example, the loop delay may vary significantly across PVT (Process, Voltage, and Temperature). In addition, different hosts may provide peripheral clocks that operate at different frequencies. Due to the variance in the loop delay and peripheral clock frequencies, the data may be provided on the bus on or near a transition of the peripheral clock, which may result in the host incorrectly reading the data.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

FIG. 1A is a block diagram of a non-volatile memory system of an embodiment;

FIG. 1B is a block diagram illustrating an exemplary storage module of an embodiment;

FIG. 1C is a block diagram illustrating a hierarchical storage system of an embodiment;

FIG. 3 is a block diagram of an example of a delay compensation circuit;

FIG. 4 illustrates an example of a timing relationship between a peripheral clock, a data signal, and a data clock;

DETAILED DESCRIPTION

Overview

Figure 2:
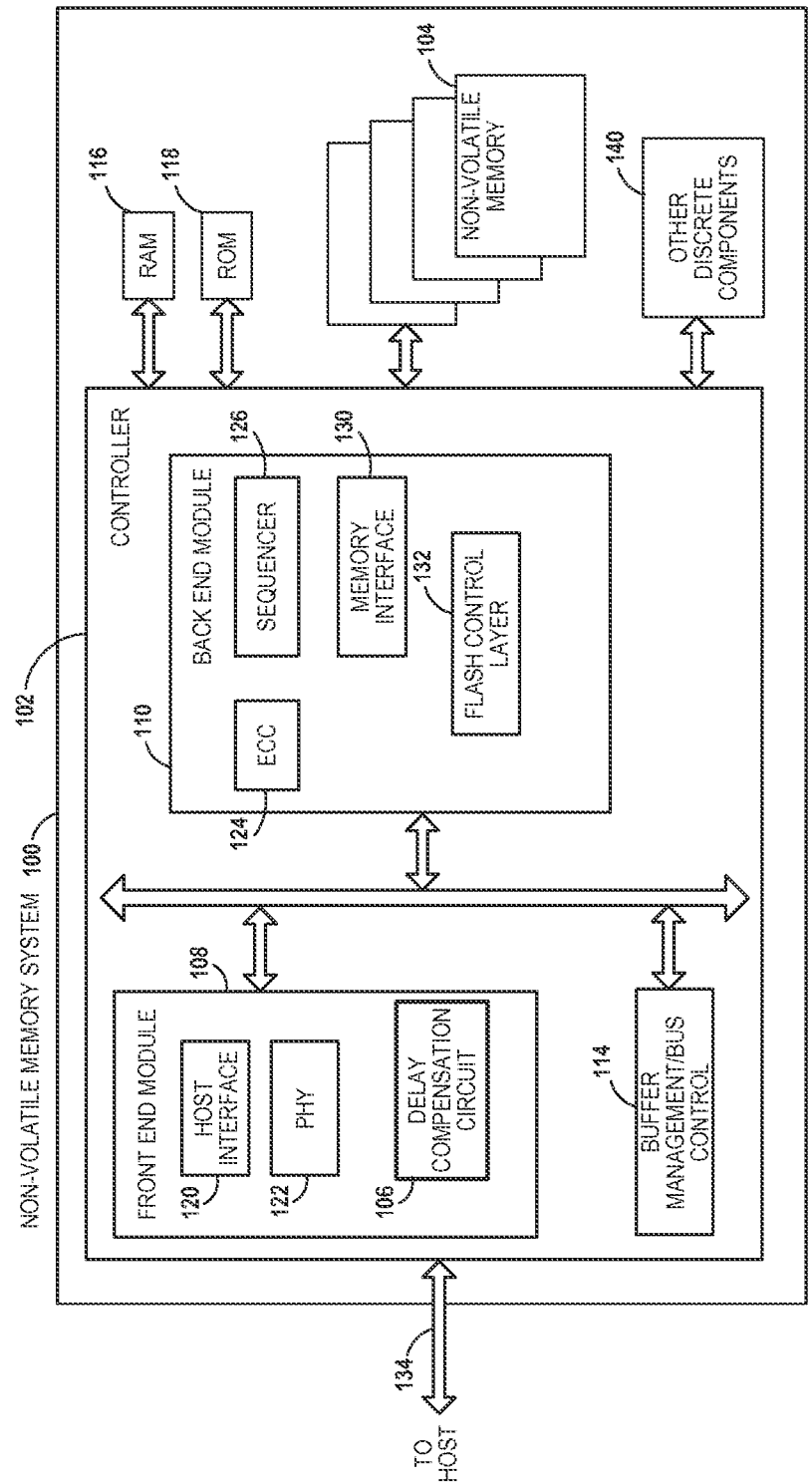
FIG. 2 is a block diagram illustrating exemplary components of the controller of the non-volatile memory system illustrated in FIG. 1A according to an embodiment.

By way of introduction, the below embodiments relate to a circuit and method for delay compensation. In one embodiment, a method for delay compensation is performed. A data clock may be generated from a peripheral clock received over a bus from a host. Sample data may be provided in a data signal on the bus in response to an edge of the data clock, where the edge of the data clock is triggered by an initial edge of the peripheral clock. A delay of the data clock relative to the peripheral clock may be selected based on a time difference between the initial edge of the peripheral clock and a time at which the sample data is detected on the bus. A delayed data clock having the selected delay relative to the peripheral clock may be generated. A request for data may be received from the host over the bus. The requested data may be provided on the bus in response to an edge of the delayed data clock.

In another embodiment, a memory system is provided comprising a memory and a controller in communication with the memory. The controller may be configured to receive a peripheral clock from a bus and to provide data on the bus in a data signal in response to an edge of a data clock. The controller may be further configured to shift the data clock relative to the peripheral clock based on the data signal provided to the bus such that the data is readable on the bus at a predetermined edge of the peripheral clock.

In yet another embodiment, a delay compensation circuit is provided comprising a data delay circuit and a data clock circuit. The data delay circuit may be configured to transmit data on a bus in a data signal, where transmission of the data is triggered by an edge of a data clock. The data clock circuit may be configured to adjust a phase of the data clock relative to a peripheral clock according to feedback from the data signal on the bus. The data delay circuit may be further configured to transmit the data on the bus in the data signal at a targeted portion of a full clock cycle of the peripheral clock after the phase of the data clock is adjusted by the data clock circuit. The targeted portion may be a fraction of the full clock cycle, and the peripheral clock may be received on the bus.

In some embodiments, the data clock circuit may include a delay locked loop configured to adjust the phase of the data clock relative to the peripheral clock according to a feedback clock from the data signal on the bus, the phase of the data clock adjusted to form a predetermined delay of the feedback clock relative to a reference clock that has a different frequency than the peripheral clock.

In some embodiments, the data clock circuit may comprise a sampling module and a decision module. The sampling module may comprise sampling flip-flops clocked by data clocks that are phase-shifted from the peripheral clock, where the flip-flops are configured to sample the data signal. The decision module may be configured to select, from the data clocks, the data clock to trigger the transmission of the data, where the data clock selected is based on outputs of the sampling flip-flops.

Other embodiments are possible, and each of the embodiments may be used alone or together in combination. Accordingly, various embodiments will now be described with reference to the attached drawings.

Exemplary Embodiments

As mentioned in the background section above, data may be provided on a bus for transmission to a host on or near a transition of a peripheral clock due to loop delays and varying frequencies of the peripheral clock. References to a "clock" herein, such as the data clock 308, refer to an electrical signal generated by a clock device, not the clock device. As a result, the host may incorrectly read the data. A tuning procedure is described in the UHS-I standard to help address loop delays, but hosts often fail to implement the tuning procedure.

The following embodiments may be used to help avoid providing data on the bus on or near a transition of the peripheral clock in order to increase a likelihood that the host reads the data correctly from the bus. Before turning to these and other embodiments, the following paragraphs provide a discussion of exemplary memory systems that may be used with these embodiments. Of course, these are just examples, and other suitable types of storage modules may be used.

Memory systems suitable for use in implementing aspects of these embodiments are shown in FIGS. 1A-1C. FIG. 1A is a block diagram illustrating a non-volatile memory system according to an embodiment of the subject matter described herein. Referring to FIG. 1A, the non-volatile memory system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. The controller 102 interfaces with a host system and transmits command sequences for read, program, and erase operations to non-volatile memory die 104. Examples of the host system may include, for example, a mobile phone, a tablet computer, a digital media player, a game device, a personal digital assistant (PDA), a mobile (for example, notebook, laptop) personal computer (PC), a book reader, or any other processing device.

The controller 102 (which may be a flash memory controller) may be in the form of processing circuitry, such as a microprocessor or a processor, and a computer-readable medium that stores computer-readable program code (for example, firmware) executable by the processing circuitry. The controller 102 may include a (micro)processor, logic gates, switches, an application specific integrated circuit (ASIC), a programmable logic controller, and/or an embedded microcontroller, for example. The controller 102 may be configured with hardware and/or firmware to perform the various functions described below and shown in the flow diagrams. The controller 102 may include a delay compensation circuit 106. Alternatively or in addition, some of the components, such as the delay compensation circuit 106, which is shown as being internal to the controller 102, may be external to the controller.

As used herein, a flash memory controller is a device that manages data stored on flash memory and communicates with the host system (alternatively referred to herein as a host), such as a computer or electronic device. A flash memory controller may have functionality in addition to the specific functionality described herein. For example, the flash memory controller may format the flash memory to ensure the memory is operating properly, map out bad flash memory cells, and allocate spare cells to be substituted for future failed cells. Some part of the spare cells may be used to hold firmware to operate the flash memory controller and implement other features. In operation, when a host needs to read data from or write data to the flash memory, it will communicate with the flash memory controller. If the host provides a logical address to which data is to be read/written, the flash memory controller may convert the logical address received from the host to a physical address in the flash memory. (Alternatively, the host may provide the physical address.) The flash memory controller may also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block may be erased and reused).

The non-volatile memory die 104 may include any suitable non-volatile storage medium, including NAND flash memory cells and/or NOR flash memory cells. The memory cells may take the form of solid-state (such as flash) memory cells and may be one-time programmable, few-time programmable, or many-time programmable. The memory cells may also be single-level cells (SLC), multiple-level cells (MLC), triple-level cells (TLC), or use other memory cell level technologies, now known or later developed. Also, the memory cells may be fabricated in a two-dimensional or three-dimensional fashion.

The interface between controller 102 and non-volatile memory die 104 may be any suitable flash interface, such as Toggle Mode 200, 400, or 800. In one embodiment, the memory system 100 may be a card based system, such as a secure digital (SD) or a micro secure digital (micro-SD) card. In an alternate embodiment, the memory system 100 may be part of an embedded memory system.

Although, in the example illustrated in FIG. 1A, the non-volatile memory system 100 (alternatively referred to herein as a storage module) includes a single channel between the controller 102 and the non-volatile memory die 104, the subject matter described herein is not limited to having a single memory channel. For example, in some NAND memory system architectures like the ones in FIGS. 1B, 1C, and 2, more NAND channels may exist between the controller 102 and the non-volatile memory die 104, depending on controller capabilities. In any of the embodiments described herein, more than a single channel may exist between the controller 102 and the memory die 104, even if a single channel is shown in the drawings.

The controller 102 may be operatively in communication with the host system over a bus 134. The phrase "operatively in communication with" may mean directly in communication with or indirectly (wired or wireless) in communication with through one or more components, which may or may not be shown or described herein.

The bus 134 may be a system that transfers data between components, such as between the controller 102 and a host. In some examples, the bus 134 may include related hardware components, such as wire and/or optical fiber, and software. The bus 134 may include parallel electrical wires over which electronic signals propagate. Examples of the bus 134 may include, an Ultra High Speed (UHS) bus, an Ultra High Speed, Phase I (UHS-I) bus, an Ultra High Speed, Phase II (UHS-II) bus, a Secure Digital (SD) bus, a Secure Digital High Capacity (SDHC) bus, a Secure Digital eXtended Capacity (SDXC) bus, a Universal Serial Bus (USB), a serial advanced technology attachment (SATA) bus, a peripheral component interface express (PCIe) bus, or any other type of bus.

FIG. 1B illustrates a storage module 200 that includes multiple non-volatile memory systems 100. As such, the storage module 200 may include a storage controller 202 that interfaces with a host and with storage system 204, which includes multiple non-volatile memory systems 100. The multiple non-volatile memory systems 100 may be operably in communication with the storage module 200 over the bus 134. The interface between storage controller 202 and non-volatile memory systems 100 may be a bus interface, such as a serial advanced technology attachment (SATA) or peripheral component interface express (PCIe) interface. The storage module 200, in one embodiment, may be configured as a solid state drive (SSD), which may be configured in portable computing devices, such as laptop computers, and tablet computers.

As illustrated in FIG. 1B, each of the controllers 102 of the non-volatile memory systems 100 may include the delay compensation circuit 106. Alternatively or in addition, the storage controller 202 that interfaces with the host may include the delay compensation circuit 106.

FIG. 1C is a block diagram illustrating a hierarchical storage system 250. The hierarchical storage system 250 may include multiple storage controllers 202, each of which controls a respective storage system 204. Host systems 252 may access memories within the storage system 250 via a bus interface. In one embodiment, the bus interface may be an NVMe or fiber channel over Ethernet (FCoE) interface. In one embodiment, the system 250 illustrated in FIG. 1C may be a rack mountable mass storage system that is accessible by multiple host computers, such as would be found in a data center or other location where mass storage is needed.

Each of the storage controllers 202 may include a corresponding delay compensation circuit 106. Alternatively or in addition, each respective storage system 204 may include a corresponding delay compensation circuit 106 as shown in FIG. 1B.

FIG. 2 is a block diagram illustrating exemplary components of controller 102 in more detail. The controller 102 includes a front end module 108 that interfaces with a host over the bus 134, a back end module 110 that interfaces with the one or more non-volatile memory die 104, and various other modules that perform functions which will now be described in detail.

Modules of the controller 102 may include the delay compensation circuit 106. As explained in more detail below in conjunction with FIGS. 3-8, the delay compensation circuit 106 may perform operations to delay providing data on the bus 134 based on a peripheral clock received from the host and on feedback in the form of a data signal on the bus 134. The data signal may be provided on the bus 134 by the delay compensation circuit 106 or some other circuit of the controller 102 or some other component of the non-volatile memory system 100.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2 as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 may depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

The delay compensation circuit 106 may be logically located between the physical layer interface 122 and the bus 134. Alternatively, the delay compensation circuit 106 may be logically included in the physical layer interface 122. In some examples, the delay compensation circuit 106 may be included in the host interface 120. In still other examples, the delay compensation circuit 106 may be between the controller 102 and the bus 134 or in some other portion of the non-volatile memory system 100.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The non-volatile memory system 100 may include other discrete components 140, such as external electrical interfaces, external RAM, resistors, capacitors, or other components that may interface with controller 102. In alternative embodiments, one or more of the physical layer interface 122 and buffer management/bus controller 114 are optional components that are not necessary in the controller 102.

FIG. 3 is a block diagram of an example of the delay compensation circuit 106. The delay compensation circuit 106 may include a data delay circuit 302, a data clock circuit 304, and a pad interface 306.

The pad interface 306 may be any component that provides contacts to which lines of the bus 134 electrically couple to lines in the delay compensation circuit. The pad interface 306 may include, for example, a flip-flop for each line.

The data delay circuit 302 may be a component that receives data 320 and then provides the data 320 on the bus 134 at an edge of a data clock 308. In other words, the data delay circuit 302 may be a component that provides the data 320 on the bus 134 after a delay determined by the phase of the data clock 308. The data delay circuit 302 may provide the data 320 on the bus 134 in a data signal 310. The data signal 310 may include one or more digital signals, each representing a bit.

The data clock circuit 304 may be a component that generates the data clock 308 based on the data signal 310 provided to the bus 134. As explained in more detail below, the data clock circuit 304 may be a component that adjusts the phase of the data clock 308 relative to a peripheral clock 312, which is received on the bus 134 from a host, such that data 320 is readable on the bus 134 at a predetermined edge of the peripheral clock 312.

During operation of the non-volatile memory system 100 that includes the data delay circuit 302, a host is to provide the controller 102 with the peripheral clock 312. The host is to provide the peripheral clock 312 on the bus 134 even if the host is not reading or writing data. The peripheral clock 312 is used by the controller 102 and the delay circuit 302 for timing purposes.

FIG. 4 illustrates an example of a timing relationship between the peripheral clock 312, the data signal 310, and the data clock 308. The example illustrated in FIG. 4 describes one preferred relationship between the signals 312, 310, and 308 when the data 320 is requested by the host. Other relationships between the signals 312, 310, and 308 may be possible and/or desired.

The controller 102 may receive a request for the data 320 over the bus 134 at time $T_1$. The request may be a read request, for example. The time $T_1$ of the request corresponds to an initial edge 402 of the peripheral clock 312. The host may expect the data 320 to be provided on the bus 134 within a predetermined time period, such as within two periods of the peripheral clock 312. Accordingly, the host may attempt to read the data 320 from the bus 134 on a first edge 404 of the peripheral clock 312 after the initial edge 402. If the host fails to successfully read the data 320 from the bus 134 at the first edge 404 of the peripheral clock, then the host may attempt to read the data 320 from the bus 134 on a second edge 406 of the peripheral clock 312. If the host fails to read the data 320 at on the second edge 406, then the host may treat the read request as a timed-out request.

In view of the behavior of the host, the controller 102 is to provide the data 320 on the bus 134 before the first edge 404 of the peripheral clock 312 or before the second edge 406 of the peripheral clock 312. For example, the controller 102 may start providing the data 320 on the bus 134 in the data signal 310 at time $T_2$, which is before time $T_3$ when the host reads the data 320 at the second edge 406 of the peripheral clock 312. Because the data signal 310 may initially be unstable when the controller 102 first provides the data 320 on the bus 134, time $T_2$ should be enough before $T_3$ that the data signal 310 is stable and still includes the data 320 at time $T_3$. On the other hand, if the controller 102 first provides the data 320 on the bus 134 at time $T_3$, the same time as the host reads the data 320, then the data 320 may not be readable by the host.

A loop delay in the controller 102 is the time between time $T_1$ when the request is received and time $T_2$ when the data 320 is first provided on the bus 134. The loop delay may include delays from logic components, and even pad delays introduced by the pad interface 306.

Without the delay compensation circuit 106, the loop delay may vary significantly. For example, the loop delay may vary significantly across PVT (Process, Voltage, and Temperature). In addition, different hosts may operate at different frequencies. For example, if the non-volatile memory system 100 complies with the UHS-104 standard, then the peripheral clock 312 provided by the host may range from 100 megahertz to 208 megahertz depending on the host. Due to the variance in the loop delay, the data 320 may be provided on the bus 134 on or near a transition of the peripheral clock 312 (such as near the first or second edge 404 or 406), which may result in the host incorrectly reading the data 320.

The delay compensation circuit 106 may compensate for the variance in the loop delay. In particular, the data clock circuit 304 delays the data clock 308 relative to the peripheral clock 312 by an amount D such that the data delay circuit 302 provides the data 320 in the data signal 310 on the bus 134 (at time $T_2$) before a predetermined edge of the peripheral clock 312 (at time $T_3$).

The data clock circuit 304 may calibrate the data clock 208 when the host is not reading or writing data. Alternatively or in addition, the data clock circuit 304 may calibrate the data clock 208 when the host is idle and/or not using the non-volatile memory system 100. While the data clock circuit 304 calibrates the data clock 308, the delay compensation circuit 106 may be said to be in a calibration mode.

During calibration, the data delay circuit 302 may provide sample data in the data signal 310 on the bus 134 in response to a transition of the data clock 308. The data clock circuit 304 may compare the data signal 310 with the peripheral clock 312 and/or an attribute of the data signal 310 with the peripheral clock 312. The data clock circuit 304 may adjust the delay D in the data clock 308 and repeat until the sample data is provided on the bus 134 enough before the predetermined edge 404 or 406 of the peripheral clock 312 that the sample data is readable at the predetermined edge 404 or 406.

Although the initial edge 402 of the peripheral clock 312 appears to be the first edge on the peripheral clock 312 in FIG. 4, there may be earlier edges of the peripheral clock 312. The initial edge 402 may be considered "initial" merely because the edge 402 is coincident with receipt of the request for the data 320. More generally, the initial edge 402 may be considered "initial" because a process of providing data on the bus 134 may be initiated in response to the edge 402. Alternatively or in addition, the initial edge 402 may be considered "initial" because the edge 402 triggered an edge 408 of the data clock 308, in response to which data is provided on the bus 134.

Figure 5:
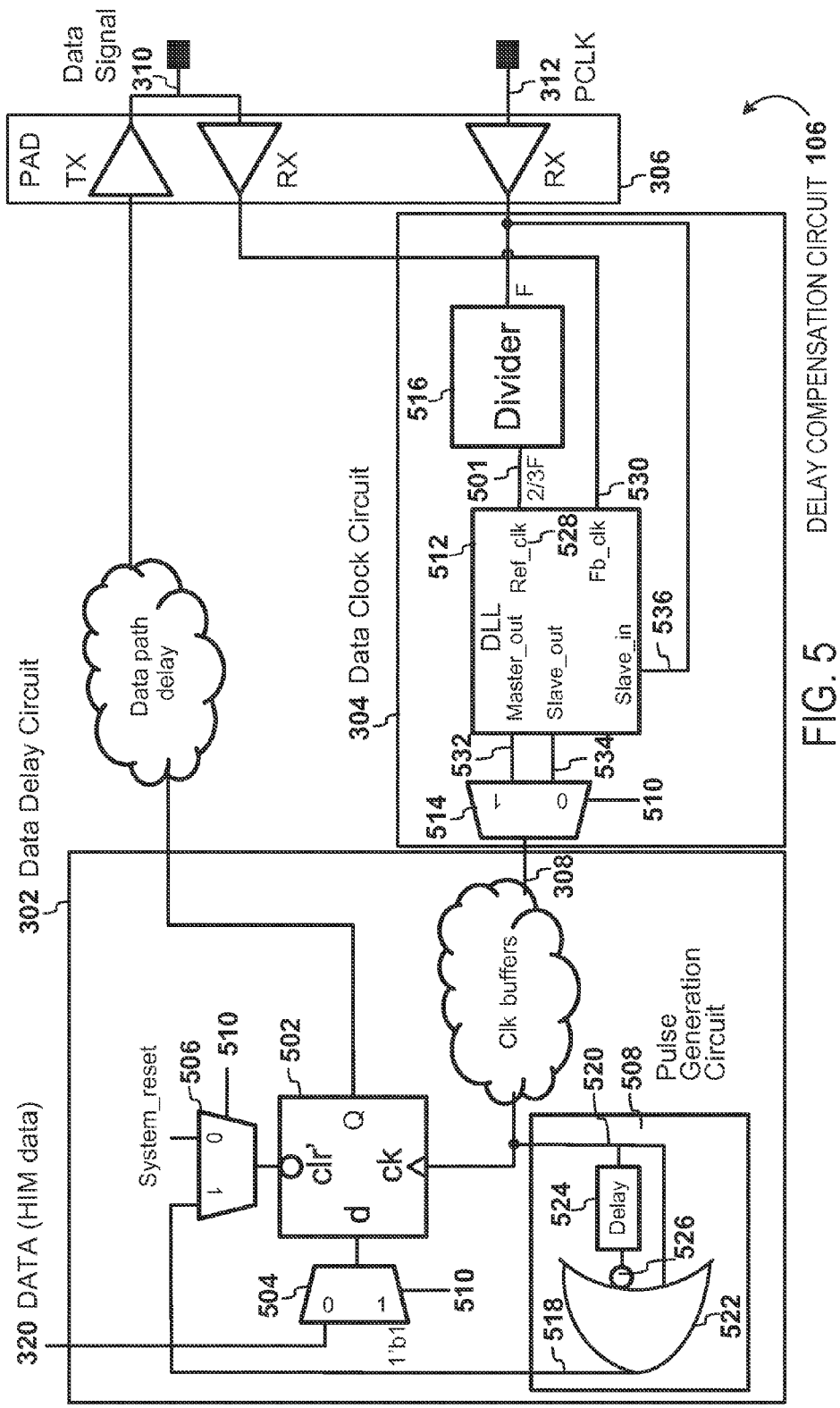
FIG. 5 is a block diagram of an embodiment of a delay compensation circuit that calibrates based on a frequency divided clock derived from the peripheral clock.

FIG. 5 is a block diagram of an embodiment of the delay compensation circuit 106 that calibrates based on a frequency divided clock 501 derived from the peripheral clock 312. The delay compensation circuit 106 includes the data delay circuit 302 and the data clock circuit 304.

The data delay circuit 302 may be configured to selectively output the data 320 or a delayed version of the data clock 308 depending on whether a train signal 510 is enabled. The data delay circuit 302 may include a flip-flop 502, a data multiplexer 504, a reset multiplexer 506, and a pulse generation circuit 508.

The flip-flop 502 may be any type of flip-flop or latch. For example, the flip-flop 502 may be D flip-flop that includes a data input, D, an output, Q, a clock input, CK, and a reset, CLR.

The data multiplexer 504 may be any component that outputs the data 320 when the train signal 510 is low, and outputs a 1 when the train signal 510 is high. The output of the data multiplexer 504 may be electrically coupled to the data input, D, of the flip-flop 502.

The pulse generation circuit 508 may be any component that generates a pulse on an output 518 when an input 520 of the pulse generation circuit 508 transitions from high to low. For example, the pulse generation circuit 508 may include an OR gate 522, an inverter 526, and a delay component 524. The input 520 of the pulse generation circuit 508 may be coupled to a first input of the OR gate 522 and to an input of the delay component 524. The output of the delay component 524 may run through the inverter 526 to a second input of the OR gate 522. The output of the OR gate 522 may be the output 518 of the pulse generation circuit 508.

The reset multiplexer 506 may be any component that outputs a system reset value when the train signal 510 is low, and outputs the output of the pulse generation circuit 508 when the train signal 510 is high. The output of the reset multiplexer 506 may be electrically coupled to the reset, CLR, of the flip-flop 502.

The data clock circuit 304 may be configured to generate the data clock 308 based on feedback from the data signal 310 on the bus 134 and on the frequency divided clock 501 derived from the peripheral clock 312. The data clock circuit 304 may include a delay locked loop (DLL) 512, a clock multiplexer 514, and a frequency divider 516.

The DLL 512 may be a component that generates a master clock 532 by applying a variable delay to a reference clock 528, and adjusts the variable delay such that a difference between a feedback clock 530 and the reference clock 528 is a predetermined delay. The predetermined delay may be a 360 degree phase shift, for example. After the variable delay is suitably adjusted, the DLL 512 may generate a slave clock 534 by applying the adjusted variable delay to a slave input 536.

The clock multiplexer 514 may be any component that outputs the master clock 532 when the train signal 510 is high, and the slave clock 534 when the train signal 510 is low. The output of the clock multiplexer 514 may be the data clock 308.

The frequency divider 516 may be any component that takes an input signal of a frequency, $f_{in}$, and generates an output signal of a frequency, $f_{out}$, where $f_{out}=(f_{in}*c)$, where c is a fraction. The frequency divider 516 may be a fractional-n frequency synthesizer, for example. The fraction may be ⅔ so that the frequency of a clock at an output of the frequency divider 516 has a frequency of (⅔)F, where F is the frequency of a clock at an input of the frequency divider 516. The fraction may be a rational number written as a/b, where a and b are integers, and a is not evenly divided by b.

The input to the frequency divider 516 may be the peripheral clock 312. The output of the frequency divider 516 may be the frequency divided clock 501.

The reference clock 528 of the DLL 512 may be the frequency divided clock 501 generated by the frequency divider 516. The feedback clock 530 of the DLL may be the data signal 310. The slave input 536 of the DLL 512 may be the peripheral clock 312. The master clock 532 and the slave clock 534 may be the two respective inputs of the clock multiplexer 514.

During calibration of the delay compensation circuit 106, the train signal 510 may be high indicating the delay compensation circuit 106 is in a calibration mode. Accordingly, the data clock 308 generated by the data clock circuit 304 is the master clock 532 of the DLL 512 during calibration. The output of the flip-flop 502 is a delayed version of the data clock 308, which is a delayed version of the master clock 532. On one hand, when the data clock 308 goes high, the output, Q, of the flip-flop 502 is the data input D, which is a binary one. On the other hand, when the data clock 308 goes low, the pulse generation circuit 508 generates a pulse to the reset, CLR, of the flip-flop 502, and the output, Q, of the flip-flop 502 drops to zero. Therefore, data signal 310 on the bus is a delayed version of the master clock 532 of the DLL 512.

The DLL 512 generates the master clock 532 by applying a variable delay to a feedback clock 530, which is a slightly delayed version of the data signal 310. The DLL 512 adjusts the variable delay until a difference between the reference clock 528 and the feedback clock 530 is a predetermined delay. If the predetermined delay is a 360 degree phase shift and the frequency divided clock is two-thirds the frequency of the peripheral clock 312, then the variable delay will cause the feedback clock 530 to be delayed 1.5 periods of the peripheral clock 312. The DLL 512 may also apply the variable delay to the slave input 536, which is the peripheral clock 312, in order to generate the slave clock 534.

Once the DLL 512 determines the desired variable delay, the calibration may be turned off. When the calibration of the delay compensation circuit 106 is turned off, the train signal 510 may be low. The flip-flop 502 is then clocked by the slave clock 534. The data input of the flip-flop 502 is the data 320. Accordingly, the output, Q, of the flip-flop 502 provides the data 320 on the bus 134 in the data signal 310 with a delay of about 1.5 periods of the peripheral clock 312.

Figure 6:
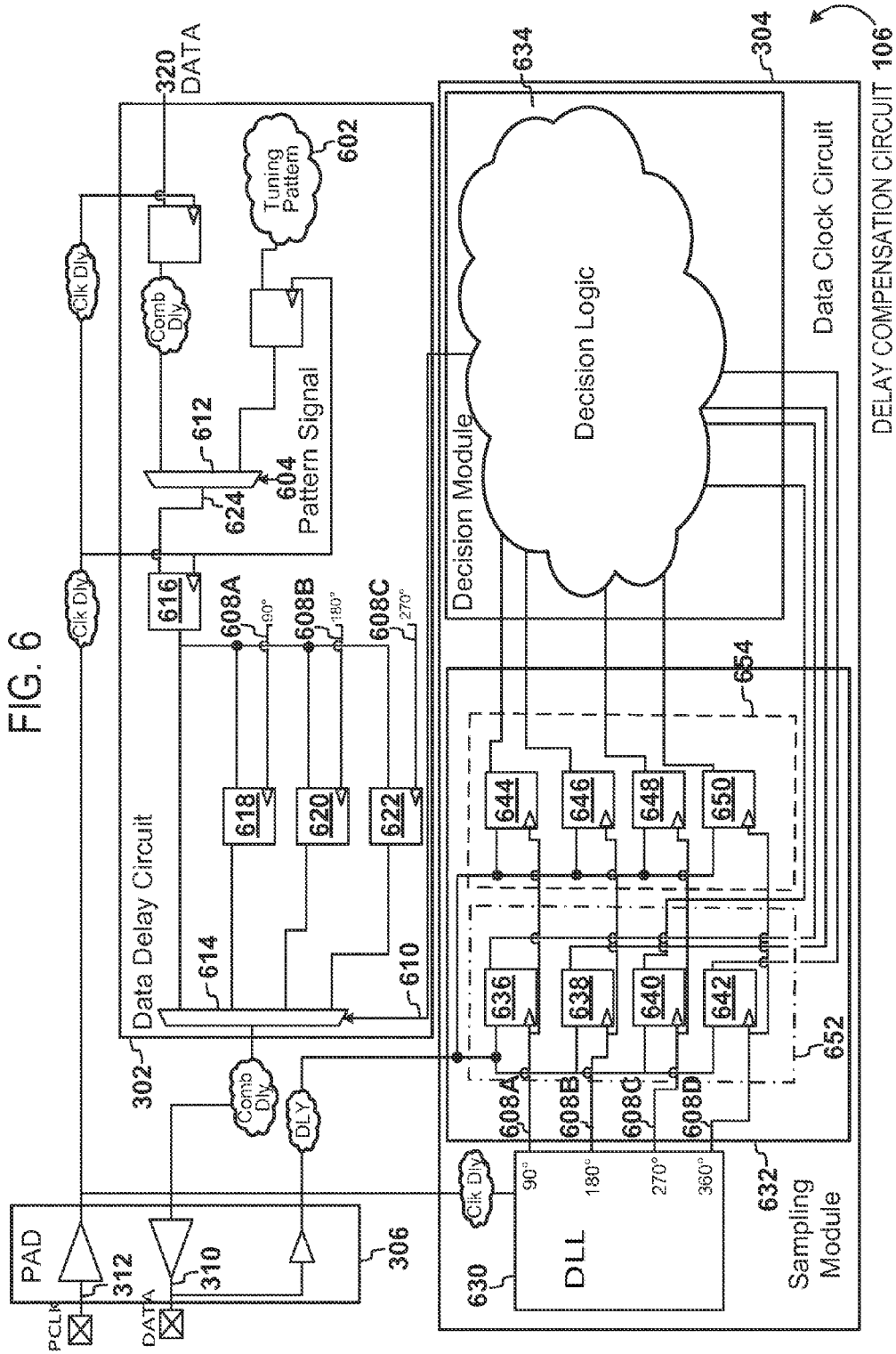
FIG. 6 is a block diagram of an embodiment of a delay compensation circuit that calibrates based on a determination of when sampled data is correctly read.

FIG. 6 is a block diagram of an embodiment of the delay compensation circuit 106 that calibrates based on a determination of when sampled data is correctly read. The delay compensation circuit 106 includes the data delay circuit 302 and the data clock circuit 304.

The data delay circuit 302 may be any circuit configured to impose a delay on the data 320 or on a tuning pattern 602 based on an indication in a pattern signal 604, where the delay imposed by the data delay circuit 302 depends on a phase of a data clock 608A, 608B, or 608C, where one of the data clocks 608A, 608B, or 608C is effectively selected by a delay selection signal 610. Alternatively or in addition, the data delay circuit 302 may be any circuit configured to provide the data 320 on the bus 134 after imposition of the delay determined by the phase of the data clock 608A, 608B, or 608C, effectively selected by the delay selection signal 610. The data delay circuit 302 may include a data selector 612, a delay selector 614, and data flip-flops 616, 618, 620, and 622.

The data selector 612 may be any component that selectively outputs data, such as a multiplexor. Inputs to the data selector 612 may be the data 320 and the tuning pattern 602. The tuning pattern 602 may be any predetermined pattern of bits. The pattern signal 604 may indicate to the data selector 612 whether to select the data 320 or the tuning pattern 602. The output of the data selector 612 is selected data 624. For example, the selected data 624 may be the data 320 when the pattern signal 604 is low and the tuning pattern 602 when the pattern signal 604 is high.

The delay selector 614 may be any component that selectively outputs data, such as a multiplexor. The delay selection signal 610 may indicate to the delay selector 614 which input of the delay selector 614 to output. The output of the delay selector 614 may be the data signal 310. Inputs to the delay selector 614 may be outputs of the data flip-flops 616-622.

Each of the data flip-flops 616-622 may be any type of flip-flop or latch. For example, each data flip-flop 616, 618, 620, or 622 may be a D flip-flop that includes an input, D, an output, Q, and a clock input, CK.

A first one of the data flip-flops 616 may be clocked by the peripheral clock 312 and receive the selected data 624 as its data input. The output of the first one of the data flip-flops 616 may be one of the selectable inputs to the delay selector 614. The output of the first one of the data flip-flops 616 may the input to the remaining data flip-flops 618, 620, and 622. Each one of the remaining data flip-flops 618, 620, and 622 may be clocked by a corresponding one of the data clocks 608A, 608B, or 608C. Each of the data clocks 608A, 608B, or 608C is a clock shifted 90 degrees, 180 degrees, and 270 degrees, respectively from the peripheral clock 312. The outputs of the remaining data flip-flops 618, 620, and 622 are fed into the inputs of the delay selector 614.

The data clock circuit 304 may be any circuit configured to sample the data signal 310 over time and determine a delay in the data clock, 608A, 608B, or 608C, relative to the peripheral clock 312 such that the data 320 is readable on the bus 134 at a predetermined edge of the peripheral clock 312. The data clock circuit 304 may include a delay locked loop (DLL) 630, a sampling module 632, and a decision module 634.

The DLL 630 may be any component that generates clocks that are out of phase with an incoming clock by predetermined phase shifts. In the example illustrated in FIG. 6, the DLL 630 is configured to generate four data clocks 608A, 608B, 608C, and 608D that are clocks shifted 90 degrees, 180 degrees, 270 degrees, and 360 degrees, respectively, from the peripheral clock 312.

The sampling module 632 may be any circuit that samples the data signal 310 at the predetermined phase shifts of the peripheral clock 312. The example of the sampling module 632 illustrated in FIG. 6 includes two stages 652 and 654 of sampling flip-flops 636-650. Each of the sampling flip-flops 636-650 may be any type of flip-flop or latch. The input of each of the sampling flip-flops 636-650 may be the data signal 310. The output of each of the sampling flip-flops 636-650 may be a sampled value that was sampled at a respective one of the predetermined phase shifts.

The sampling flip-flops, 636, 638, 640, and 642, in the first stage 652 may be clocked by the data clocks 608A, 608B, 608C, and 608D, respectively, each of which is shifted 90 degrees, 180 degrees, 270 degrees, and 360 degrees, respectively from the peripheral clock 312. Accordingly, the sampling flip-flops 636, 638, 640, and 642 in the first stage 652 are configured to sample the data signal 310 at predetermined phase shifts of 90 degrees, 180 degrees, 270 degrees, and 360 degrees, respectively.

Unlike the sampling flip-flops 636-642 in the first stage 652, the sampling flip-flops 644-650 in the second stage 654 may be disabled during a first full clock cycle of the peripheral clock 312, and enabled during a second full clock cycle of the peripheral clock 312. The sampling flip-flops, 644, 646, 648, and 650, in the second stage 654 may be clocked by the data clocks 608A, 608B, 608C, and 608D, respectively, each of which is shifted 90 degrees, 180 degrees, 270 degrees, and 360 degrees, respectively from the peripheral clock 312. Accordingly, the sampling flip-flops 644, 646, 648, and 650 in the second stage 654 are configured to sample the data signal 310 at predetermined phase shifts of 450 degrees, 540 degrees, 630 degrees, and 720 degrees, respectively.

The decision module 634 may be any circuit configured to determine at which the predetermined phase shifts relative to the peripheral clock 312 is the data 320 or the tuning pattern 602 readable on the bus 134 from the data signal 310. Alternatively or in addition, the decision module 634 may be any circuit configured to indicate to the data delay circuit 302 when to provide the data 320 or the tuning pattern 602 in the data signal 310 on the bus 134. In the example illustrated in FIG. 6, the decision module 634 is configured to indicate to the delay circuit 302 when to provide the data 320 and/or the tuning pattern 602 on the bus 134 by providing the delay selection signal 610 and the data clocks 608A, 608B, and 608C to the delay circuit 302.

In one embodiment, the decision module 634 may include comparators (not shown) and a delay selection circuit (not shown). Each one of comparators is for a corresponding one of the sampling flip-flops 636-650. Each comparator may compare the output of the corresponding sampling flip-flop with the tuning pattern 602. The outputs of the comparators may be provided to the delay selection circuit. The delay selection circuit may implement logic that maps the outputs of the comparators, which together may represent a binary number input, to a binary number representing the delay selection signal 610.

Table 1 below illustrates example values of the delay selection signal 610.

TABLE 1

| Value of Delay Selection Signal | Delay |
|---|---|
| 00 | None |
| 01 | 90 Degree Shift |
| 10 | 180 Degree Shift |
| 11 | 270 Degree Shift |

Table 2 below illustrates examples of the binary number input that may be formed from the outputs of the comparators and the corresponding desired delay. The binary number input may be formed from the digits R1R2R3R4R5R6R7R8, where $R_n$ represents the output of the $n^{th}$ comparator, where the higher n, the larger the delay (phase shift). The digit $R_n$ may be "1" when the output of the corresponding sampling flip-flop 636-650 matched the tuning pattern 602 for the $n^{th}$ comparator, or "0" otherwise.

TABLE 2

| Binary Input Number | Delay |
|---|---|
| 1111 0000 | 180 Degree Shift |
| 0111 1000 | 90 Degree Shift |
| 0011 1100 | None |
| 0001 1110 | 180 Degree Shift |
| 0000 1111 | 90 Degree Shift |
| 0000 0111 | None |
| 0000 0011 | None |
| 0000 0001 | None |

Values of the binary number input other than those listed in Table 2 are possible. Each of these other values may be handled by treating each value like a next higher value that is listed in Table 2, where the right-most digit is the most significant digit. For example, a binary number input value of 00011100 may be mapped to a 0001 1110 delay value, which according to Table 2, is a 180 degree shift.

Figure 7:
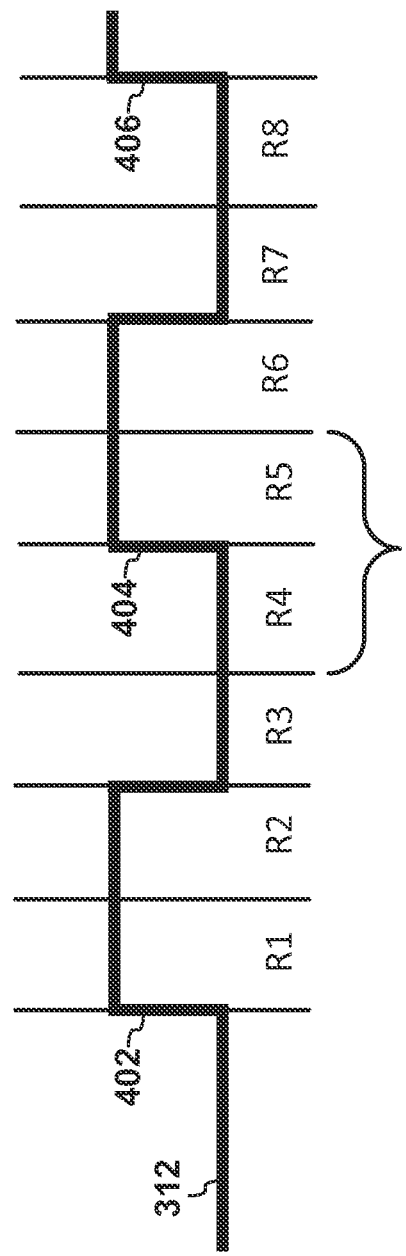
FIG. 7 illustrates two cycles of a peripheral clock.

The values in Table 2 may also be visualized by examining response windows. FIG. 7 illustrates two cycles of the peripheral clock 312. The two cycles are divided into eight response windows, R1-R8, each representing a quarter of a cycle. A bit of the tuning pattern 602 may be provided in the data signal 310 on the bus 134 in response to the initial edge 402 of the peripheral clock 312. If the first sampling flip-flop 636 in the first stage 652 detects the tuning pattern 602, then the tuning pattern 602 is detected in the first response window, R1, and the R1 bit in the binary input number of Table 2 is a "1." Similarly, if the second sampling flip-flop 638 in the first stage 652 detects the tuning pattern 602, then the tuning pattern 602 is detected in the second response window, R2, and the R2 bit in the binary input number of Table 2 is a "1." More generally, if the nth sampling flip-flop 636, 638, 640, 642, 644, 646, 648, or 650 detects the tuning pattern 602, then the tuning pattern 602 is detected in the nth response window, Rn, and the Rn bit in the binary input number of Table 2 is a "1."

If the tuning pattern 602 is detected in the response window R4 or R5, then the data 320 will also be provided on the bus 134 in the response window R4 or R5 unless the delay selection signal 610 is set such that the data delay circuit 302 imposes an additional delay. This may be problematic because the response windows R4 and R5 surround the first edge 404 of the peripheral clock 312 so the data signal 310 may potentially be in an indeterminate state if read by the host on the first edge 404 of the peripheral clock 312. To avoid this possibility, the delay selection signal 610 may be set to indicate that the data 320 should be delayed. For example, if the tuning pattern 602 is detected in response window R4 (binary input number "0001 1110" in Table 2), then the delay selection signal 610 may be set to "11" to indicate that the data delay circuit 302 is to impose a 270 degree shift. With this imposed delay, the data 320 will be provided on the bus 134 in response window R7 instead of R4.

The information from Table 1 and Table 2 may be combined to form a map between each binary input number and a corresponding value for the delay selection signal 610. The delay selection circuit may include logic gates and/or a combination of hardware and software that implement the mapping. Alternatively or in addition, the controller 102 may average results from multiple bits of the tuning pattern 602 to determine the proper value for the delay selection signal 610.

During calibration, the decision module 634 or other circuit may direct the data selector 612 to select the tuning pattern 602 by setting the pattern signal 604 appropriately. Each bit of the tuning pattern 602 may be provided to the data selector 612 for two full cycles of the peripheral clock 312 before moving to the next bit of the tuning pattern 602. This is because the sampling module 632 samples the data signal 310 across one cycle of the peripheral clock 312. In other examples, each bit of the tuning pattern 602 may be provided to the data selector 612 for at least as long as the time across which the sampling module 632 samples the data signal 310. In some examples, the tuning pattern 602 may include only one bit.

When calibration starts, the decision module 634 may indicate to the delay selector 614 that no delay is to be imposed. Consequently, when the sampling module 632 and the decision module 634 determine which of the sampling flip-flops 636-650 can properly read a bit of the tuning pattern 602, then a delay has been determined. The determined delay is the delay between the initial edge 402 of the peripheral clock and a time when the tuning pattern 602 and/or the data 320 is provided on the bus 134. The delay may effectively a measurement of the loop delay of the delay compensation circuit 106.

Based on the detected loop delay indicated by the binary input number, the decision module 634 may determine the desired delay and provide an indication of the desired delay to the data delay circuit 302 via the delay selection signal 610. Once calibration is done, the decision module 634 may continue to provide an indication of the desired delay to the data delay circuit 302 via the delay selection signal 610. Accordingly, the data clock may be effectively shifted relative to the peripheral clock 312 based on detection of the data in the data signal 310 and based on a comparison of the data detected to the tuning pattern 602.

The response windows R1-R8 and the values in Tables 1 and 2 are just one possible configuration. For example, any number of response windows may be chosen. The size of each response window may be different than in the illustrated example. Although a high bit in the example binary input number indicates detection of the tuning pattern 602, a low bit in other examples may indicate detection of the tuning pattern 602. As another example, the desired delays for each response window may be different than those listed in Table 1.

Figure 8:
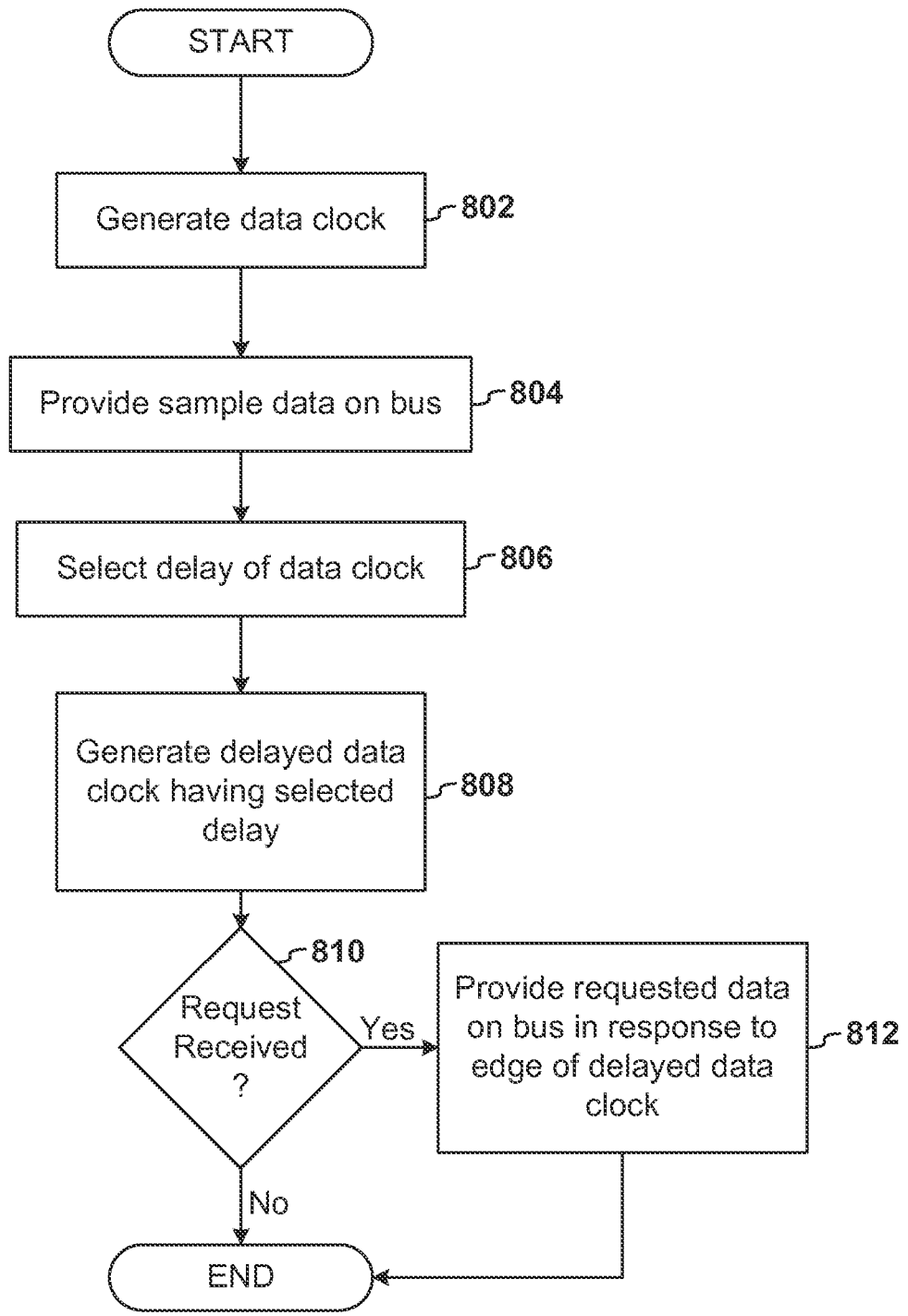
FIG. 8 is flow diagram illustrating example logic of the non-volatile memory system and/or the delay compensation circuit.

FIG. 8 is flow diagram illustrating example logic of the non-volatile memory system 100 and/or the delay compensation circuit 106. The logic may include additional, different, or fewer operations. The operations may be executed in a different order than illustrated in FIG. 8.

Operations may begin in which the data clock 308 may be generated (802) from the peripheral clock 312. Sample data may be provided (804) in the data signal 310 on the bus 134 in response to an edge of the data clock 308, where the edge of the data clock is triggered by an initial edge of the peripheral clock 312. In a first example, the sample data may be a delayed version of the data clock 308 generated by the flip-flop 502 illustrated in FIG. 5. In a second example, the sample data may be the tuning pattern 602 illustrated in FIG. 6.

A delay of the data clock 308 relative to the peripheral clock 312 may be selected (806) based on a time difference between the initial edge 402 of the peripheral clock 312 and a time at which the sample data is detected on the bus 134. In a first example, selecting the delay may include generating the master clock 532 by the delay locked loop 512 having the data signal 310 on the bus 134 as the feedback clock 530 and the frequency divided clock 501 derived from the peripheral clock 312 as the reference clock 528. In a second example, selecting the delay may include selecting the delayed data clock from a plurality of data clocks 608A-C, each of the data clocks 608A-C having a predetermined phase shift different than the other data clocks in the plurality of data clocks 608A-C.

Operations may continue in which a delayed data clock having the selected delay relative to the peripheral clock 312 may be generated (808). For example, the delayed data clock may be generated by the DLL 512 or 630.

A request for data may be received (810) from the host over the bus 134. For example, the request may be a read request.

The requested data may be provided (812) on the bus 134 in response to an edge of the delayed data clock. For example, the flip-flop 502 illustrated in FIG. 5 or a selected one of the data flip-flops 616-622 illustrated in FIG. 6 may provide the requested data on the bus 134.

The system 100 and/or the delay compensation circuit 106 may be implemented with additional, different, or fewer components. For example, the system 100 may include only the delay compensation circuit 106.

Each component may include additional, different, or fewer components. For example, the delay compensation circuit 106 may or may not include the pad interface 306. In another example, the sampling module may include additional or fewer sampling flip-flops 636-650 than illustrated in FIG. 6.

The system 100 and/or the delay compensation circuit 106 may be implemented in many different ways. Each module, circuit, or component, such as the decision module 634, may be hardware or a combination of hardware and software. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include memory hardware, for example, that comprises instructions executable with a processor to implement one or more of the features of the module. When any one of the modules includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module, such as the decision hardware module.

Finally, as mentioned above, any suitable type of memory may be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which may also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices may be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions may also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations may be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories may be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the embodiments as described herein and as understood by one of skill in the art.

Furthermore, although specific components are described above, methods, systems, and articles of manufacture described herein may include additional, fewer, or different components. For example, a processor may be implemented as a microprocessor, microcontroller, application specific integrated circuit (ASIC), discrete logic, or a combination of other type of circuits or logic. Similarly, memories may be DRAM, SRAM, Flash or any other type of memory. Flags, data, databases, tables, entities, and other data structures may be separately stored and managed, may be incorporated into a single memory or database, may be distributed, or may be logically and physically organized in many different ways. The components may operate independently or be part of a same program or apparatus. The components may be resident on separate hardware, such as separate removable circuit boards, or share common hardware, such as a same memory and processor for implementing instructions from the memory.

A second action may be said to be "in response to" a first action independent of whether the second action results directly or indirectly from the first action. The second action may occur at a substantially later time than the first action and still be in response to the first action. Similarly, the second action may be said to be in response to the first action even if intervening actions take place between the first action and the second action, and even if one or more of the intervening actions directly cause the second action to be performed. For example, a second action may be in response to a first action if the first action sets a flag and a third action later initiates the second action whenever the flag is set.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

It is intended that the foregoing detailed description be understood as an illustration of selected forms that embodiments may take and not as a definition of all embodiments. Finally, it should be noted that any aspect of any of the embodiments described herein may be used alone or in combination with one another.

What is claimed is:

1. A memory system comprising:
a memory; and
a controller in communication with the memory, wherein the controller is configured to:
receive a peripheral clock from a bus;
provide data on the bus in a data signal in response to an edge of a data clock; and
shift the data clock relative to the peripheral clock based on the data signal provided to the bus such that the data is readable on the bus at a predetermined edge of the peripheral clock.

2. The memory system of claim 1 wherein the controller is configured to shift the data clock via a selection of the data clock from a plurality of data clocks, each of the data clocks having a phase relative to the peripheral clock that is different than any other data clock in the plurality of data clocks.

3. The memory system of claim 1 wherein the controller is further configured to shift the data clock relative to the peripheral clock based on detection of the data in the data signal and based on a comparison of the data detected to tuning pattern.

4. The memory system of claim 1 wherein the controller is further configured to shift the data clock based on a determination of when data is detected in the data signal on the bus relative to the peripheral clock.

5. The memory system of claim 1 wherein the controller is configured to shift the data clock in response to detection of the data on the bus within a quarter clock cycle of a first edge of the peripheral clock, wherein the first edge is one clock cycle after an initial edge of the peripheral clock, and the edge of the data clock is in response to the initial edge of the peripheral clock.

6. The memory system of claim 1, wherein the data provided on the bus corresponds to the data clock and the data clock is shifted by a delay locked loop configured to generate the data clock based on feedback from the data signal on the bus and on a reference clock set to a frequency divided clock derived from the peripheral clock.

7. A delay compensation circuit comprising:
a data delay circuit configured to transmit data on a bus in a data signal, transmission of the data triggered by an edge of a data clock; and
a data clock circuit configured to adjust a phase of the data clock relative to a peripheral clock according to feedback from the data signal on the bus, wherein the data delay circuit is further configured to transmit the data on the bus in the data signal at a targeted portion of a full clock cycle of the peripheral clock after the phase of the data clock is adjusted by the data clock circuit, wherein the targeted portion is fraction of the full clock cycle, and the peripheral clock is received on the bus.

8. The delay compensation circuit of claim 7, wherein the data clock circuit comprises a delay locked loop configured to generate the data clock as a master clock from a reference clock and a feedback clock, the data signal on the bus comprises a delayed version of the data clock, and the feedback clock is the data signal on the bus.

9. The delay compensation circuit of claim 8, wherein the reference clock is a frequency divided clock derived from the peripheral clock.

10. The delay compensation circuit of claim 9, wherein the frequency divided clock is two-thirds the frequency of the peripheral clock and the delay locked loop is configured to adjust the phase of the data clock until a difference between the reference clock and the feedback clock is a full clock cycle of the reference clock.

11. The delay compensation circuit of claim 7, wherein the data delay circuit is further configured to selectively transmit the data or the data clock on the bus in the data signal depending on whether the delay compensation circuit is in a calibration mode.

12. The delay compensation circuit of claim 7, wherein the data clock circuit comprises a delay locked loop configured to adjust the phase of the data clock relative to the peripheral clock according to a feedback clock from the data signal on the bus, the phase of the data clock adjusted to form a predetermined delay of the feedback clock relative to a reference clock that has a different frequency than the peripheral clock.

13. The delay compensation circuit of claim 7, wherein the data clock circuit comprises a sampling module and a decision module, the sampling module comprises sampling flip-flops clocked by data clocks that are phase-shifted from the peripheral clock, the flip-flops are configured to sample the data signal, and the decision module is configured to select, from the data clocks, the data clock to trigger the transmission of the data, the data clock selected based on outputs of the sampling flip-flops.

14. A method comprising:
  generating a data clock from a peripheral clock received over a bus from a host;
  providing sample data in a data signal on the bus in response to an edge of the data clock, the edge of the data clock triggered by an initial edge of the peripheral clock;
  selecting a delay of the data clock relative to the peripheral clock based on a time difference between the initial edge of the peripheral clock and a time at which the sample data is detected on the bus;
  generating a delayed data clock having the selected delay relative to the peripheral clock;
  receiving a request for requested data from the host over the bus; and
  providing the requested data on the bus in response to an edge of the delayed data clock.

15. The method of claim 14 wherein selecting the delay comprises generating a master clock by a delay locked loop having the data signal on the bus as a feedback clock and a clock derived from the peripheral clock as a reference clock.

16. The method of claim 15 wherein generating the delayed data clock comprises generating the delayed data clock as a slave clock of the delay locked loop, the delay locked loop having the peripheral clock as a slave input.

17. The method of claim 14 wherein selecting the delay comprises determining the time at which the sample data is detected on the bus from outputs of sampling flip-flops clocked with data clocks phase shifted relative to the peripheral clock.

18. The method of claim 14 wherein selecting the delay comprises adding a predetermined phase shift to a phase of the data clock if the time difference between the initial edge of the peripheral clock and the time at which the sample data is detected on the bus falls within 75 percent and 125 percent of one full period of the peripheral clock.

19. The method of claim 14 wherein selecting the delay comprises selecting the delayed data clock from a plurality of data clocks, each of the data clocks having a predetermined phase shift different than other data clocks in the plurality of data clocks.

20. The method of claim 19 wherein selecting the delayed data clock from the plurality of data clocks comprises selecting a data flip-flop from a plurality of data flip-flops to output the requested data, wherein each of the data flip-flops is clocked by a corresponding one of the data clocks.

* * * * *